United States Patent
Ronay et al.

(10) Patent No.: US 12,205,878 B2
(45) Date of Patent: *Jan. 21, 2025

(54) CONTINUOUS INTERCONNECTS BETWEEN HETEROGENEOUS MATERIALS

(71) Applicant: Liquid Wire Inc., Portland, OR (US)

(72) Inventors: Mark William Ronay, Portland, OR (US); Jorge E. Carbo, Jr., Portland, OR (US); Trevor Antonio Rivera, Portland, OR (US); Charles J. Kinzel, Portland, OR (US); Michael Adventure Hopkins, Portland, OR (US); Sai Srinivas Desabathina, Beaverton, OR (US)

(73) Assignee: Liquid Wire Inc., Portland, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/316,586

(22) Filed: May 12, 2023

(65) Prior Publication Data
US 2024/0047334 A1     Feb. 8, 2024

Related U.S. Application Data

(63) Continuation of application No. 17/303,030, filed on May 18, 2021, now Pat. No. 11,688,677, which is a
(Continued)

(51) Int. Cl.
*H01L 23/48*    (2006.01)
*H01L 21/48*    (2006.01)
(Continued)

(52) U.S. Cl.
CPC ...... *H01L 23/49833* (2013.01); *H01L 21/485* (2013.01); *H01L 21/4857* (2013.01);
(Continued)

(58) Field of Classification Search
CPC ............ H01L 23/49833; H01L 21/485; H01L 21/4857; H01L 21/486; H01L 21/56;
(Continued)

(56) References Cited

U.S. PATENT DOCUMENTS

| | | |
|---|---|---|
| 4,770,641 A | 9/1988 | Rowlette |
| 7,959,058 B1 | 6/2011 | Crane et al. |

(Continued)

FOREIGN PATENT DOCUMENTS

| | | |
|---|---|---|
| CN | 1551343 A | 12/2004 |
| CN | 107710887 A | 2/2018 |

(Continued)

OTHER PUBLICATIONS

"U.S. Appl. No. 16/885,854, Corrected Notice of Allowability mailed Feb. 15, 2023", 2 pgs.
(Continued)

*Primary Examiner* — Theresa T Doan
(74) *Attorney, Agent, or Firm* — Quinn IP Law

(57) ABSTRACT

A structure may include a first material, a second material joined to the first material at a junction between the first and second materials, and one or more media extending across the junction to form a continuous interconnect between the first and second materials, wherein the first and second materials are heterogeneous. The structure may further include a transition at the junction between the first and second materials. The one or more media may include a functional material which may be electrically conductive. The structure may further include a third material joined to the second material at a second junction between the second and third materials, the media may extend across the second junction to form a continuous interconnect between the first, second, and third materials, and the second and third materials may be heterogeneous.

20 Claims, 5 Drawing Sheets

Related U.S. Application Data continuation of application No. 16/885,854, filed on May 28, 2020, now Pat. No. 11,682,615.

(60) Provisional application No. 62/853,481, filed on May 28, 2019.

(51) Int. Cl.
  *H01L 21/56* (2006.01)
  *H01L 23/31* (2006.01)
  *H01L 23/498* (2006.01)
  *H01L 23/52* (2006.01)

(52) U.S. Cl.
  CPC ............ *H01L 21/486* (2013.01); *H01L 21/56* (2013.01); *H01L 23/3157* (2013.01); *H01L 23/49822* (2013.01); *H01L 23/49838* (2013.01); *H01L 23/4985* (2013.01)

(58) Field of Classification Search
  CPC ........... H01L 23/3157; H01L 23/49822; H01L 23/49838; H01L 23/4985; H01L 23/145; H05K 1/09; H05K 1/189; H05K 2201/0326; H05K 2201/058; H05K 1/147
  USPC ....................................................... 257/773
  See application file for complete search history.

(56) References Cited

U.S. PATENT DOCUMENTS

| | | | |
|---|---|---|---|
| 8,134,082 | B2 | 3/2012 | Nakamura et al. |
| 11,682,615 | B2 | 6/2023 | Ronay et al. |
| 11,688,677 | B2 * | 6/2023 | Ronay .................. H01L 23/145 257/773 |
| 2004/0184219 | A1 | 9/2004 | Otsuka et al. |
| 2009/0175019 | A1 | 7/2009 | Koyama et al. |
| 2011/0180307 | A1 | 7/2011 | Naganuma et al. |
| 2013/0281814 | A1 | 10/2013 | Tilt et al. |
| 2014/0231126 | A1 | 8/2014 | Hunrath et al. |
| 2015/0155430 | A1 | 6/2015 | Li |
| 2015/0179476 | A1 | 6/2015 | Tseng et al. |
| 2015/0187692 | A1 | 7/2015 | Tseng et al. |
| 2015/0279768 | A1 | 10/2015 | Rathburn |
| 2018/0008160 | A1 | 1/2018 | Virtanen |
| 2018/0247727 | A1 | 8/2018 | Ronay |
| 2020/0381349 | A1 | 12/2020 | Ronay et al. |
| 2021/0272891 | A1 | 9/2021 | Ronay et al. |

FOREIGN PATENT DOCUMENTS

| | | |
|---|---|---|
| CN | 114175280 A | 3/2022 |
| EP | 0106990 A1 | 5/1984 |
| JP | 2014505529 A | 3/2014 |
| JP | 2022534502 A | 8/2022 |
| WO | WO-2020243254 A1 | 12/2020 |

OTHER PUBLICATIONS

"U.S. Appl. No. 16/885,854, Non Final Office Action mailed Sep. 27, 2022", 9 pgs.
"U.S. Appl. No. 16/885,854, Notice of Allowance mailed Feb. 2, 2023", 9 pgs.
"U.S. Appl. No. 16/885,854, Response filed Aug. 23, 2022 to Restriction Requirement mailed Jun. 28, 2022", 10 pgs.
"U.S. Appl. No. 16/885,854, Response filed Dec. 27, 2022 to Non Final Office Action mailed Sep. 27, 2022", 8 pgs.
"U.S. Appl. No. 16/885,854, Restriction Requirement mailed Jun. 28, 2022", 6 pgs.
"U.S. Appl. No. 17/303,030, Non Final Office Action mailed Sep. 15, 2022", 8 pgs.
"U.S. Appl. No. 17/303,030, Notice of Allowance mailed Feb. 15, 2023", 7 pgs.
"U.S. Appl. No. 17/303,030, Response filed Jan. 17, 2023 to Non Final Office Action mailed Sep. 15, 2022", 6 pgs.
"U.S. Appl. No. 17/303,030, Response filed Aug. 23, 2022 to Restriction Requirement mailed Jun. 24, 2022", 6 pgs.
"U.S. Appl. No. 17/303,030, Restriction Requirement mailed Jun. 24, 2022", 6 pgs.
"Chinese Application Serial No. 202080039373.3, Notification to Make Rectification mailed Dec. 24, 2021", with machine translation, 3 pgs.
"Chinese Application Serial No. 202080039373.3, Response filed Feb. 8, 2022", with machine translation, 2 pgs.
"European Application Serial No. 20813667.1, Communication pursuant to Rule 164(1) EPC mailed Jul. 10, 2023", 17 pgs.
"European Application Serial No. 20813667.1, Extended European Search Report mailed Oct. 11, 2023", 16 pgs.
"European Application Serial No. 20813667.1, Response to Communication pursuant to Rules 161 and 162 filed Jul. 12, 2022", 8 pgs.
"International Application Serial No. PCT/US2020/034854, International Preliminary Report on Patentability mailed Dec. 9, 2021", 8 pgs.
"International Application Serial No. PCT/US2020/034854, International Search Report mailed Aug. 28, 2020", 2 pgs.
"International Application Serial No. PCT/US2020/034854, Written Opinion mailed Aug. 28, 2020", 6 pgs.
"Japanese Application Serial No. 2021-570380, Voluntary Amendment filed Mar. 22, 2023", w/ English Claims, 10 pgs.
"Japanese Application Serial No. 2021-570380, Notification of Reasons for Refusal mailed Jun. 20, 2023", w/ English Translation, 12 pgs.
"Japanese Application Serial No. 2021-570380, Response filed Aug. 10, 2023 to Notification of Reasons for Refusal mailed Jun. 20, 2023", w/ english claims, 11 pgs.
"Korean Application Serial No. 10-2021-7042896, Notice of Preliminary Rejection mailed Jul. 20, 2023", w/ English Translation, 4 pgs.
"Korean Application Serial No. 10-2021-7042896, Office Action mailed Jan. 6, 2022", with machine translation, 4 pgs.
"Korean Application Serial No. 10-2021-7042896, Response filed Feb. 9, 2022", with machine translation, 4 pgs.
"Korean Application Serial No. 10-2021-7042896, Response filed Sep. 20, 2023 to Notice of Preliminary Rejection mailed Jul. 20, 2023", w/ english claims, 14 pgs.
"Korean Application Serial No. 10-2021-7042896, Voluntary Amendment filed Mar. 13, 2023", w/ English Claims, 13 pgs.
"Stretchable printed circuit boards", Product Information, (May 8, 2019), 4 pgs.
Vanfleteren, J, "Printed circuit board technology inspired stretchable circuits", MRS Bulletin, Materials Research Society, (Mar. 2012), 254-260.

* cited by examiner

CONTINUOUS INTERCONNECTS BETWEEN HETEROGENEOUS MATERIALS

CROSS-REFERENCE TO RELATED APPLICATION

This application is a continuation of U.S. patent application Ser. No. 17/303,030, filed May 18, 2021, which is a continuation of U.S. patent application Ser. No. 16/885,854, filed May 28, 2020, which claims priority from U.S. Provisional Patent Application Ser. No. 62/853,481 filed May 28, 2019, each of which are incorporated by reference in their entirety.

BACKGROUND

The inventive principles of this patent disclosure relate generally to interconnects between two heterogeneous materials, and more specifically to structures having one or more media extending between two heterogeneous materials to form a continuous interconnect between the materials, and/or methods of forming such structures.

SUMMARY

A structure may include a first material, a second material joined to the first material at a junction between the first and second materials, and one or more media extending across the junction to form a continuous interconnect between the first and second materials, wherein the first and second materials are heterogeneous. The structure may further include a transition at the junction between the first and second materials. The transition may include a lap joint. The one or more media may include a functional material. The functional material may be electrically conductive. The functional material may include a conductive gel. The first material may be substantially more rigid than the second material. The first material may be substantially more elastic than the second material. The structure may further include a first encapsulant arranged on the first material to substantially enclose a portion of the media. The structure may further include a second encapsulant arranged on the second material to substantially enclose a portion of the media. The first material may include a via through which at least a portion of the media passes. The structure may include a lap joint at the junction between the first material and the second material, and the via passes through the lap joint. The structure may further include an electric component attached to the first material and electrically coupled to the media.

The junction between the first and second materials may include a first junction, the structure may further include a third material joined to the second material at a second junction between the second and third materials, the media may extend across the second junction to form a continuous interconnect between the first, second, and third materials, and the second and third materials may be heterogeneous. The media may be electrically conducting, and the structure may further include a first electric component attached to the first material and electrically connected to the media, and a second electric component attached to the third material and electrically connected to the media.

A sensor structure may include a first substrate comprising a first material, a conductive contact layer comprising a second material disposed on the first substrate, a second substrate comprising a third material disposed on the first substrate, and a conductive gel arranged in a pattern on the second substrate and forming a continuous electrical interconnect with the conductive contact layer, wherein at least two of the first, second, and third materials are heterogeneous. The sensor structure may further include an electric component disposed on the second substrate and electrically connected to the continuous electrical interconnect. The first substrate may include a via through which the continuous electrical interconnect connects to the conductive contact layer.

A method may include joining a first material to a second material at a junction, and forming a continuous interconnect between the first and second materials across the junction, wherein the first and second materials may be heterogeneous. The method may further include encapsulating the continuous interconnect.

BRIEF DESCRIPTION OF THE DRAWINGS

The figures are not necessarily drawn to scale and elements of similar structures or functions may generally be represented by like reference numerals for illustrative purposes throughout the figures. The figures are only intended to facilitate the description of the various embodiments described herein. The figures do not describe every aspect of the teachings disclosed herein and do not limit the scope of the claims. To prevent the drawings from becoming obscured, not all of the components, connections, and the like may be shown, and not all of the components may have reference numbers. However, patterns of component configurations may be readily apparent from the drawings.

DETAILED DESCRIPTION

Figure 1:
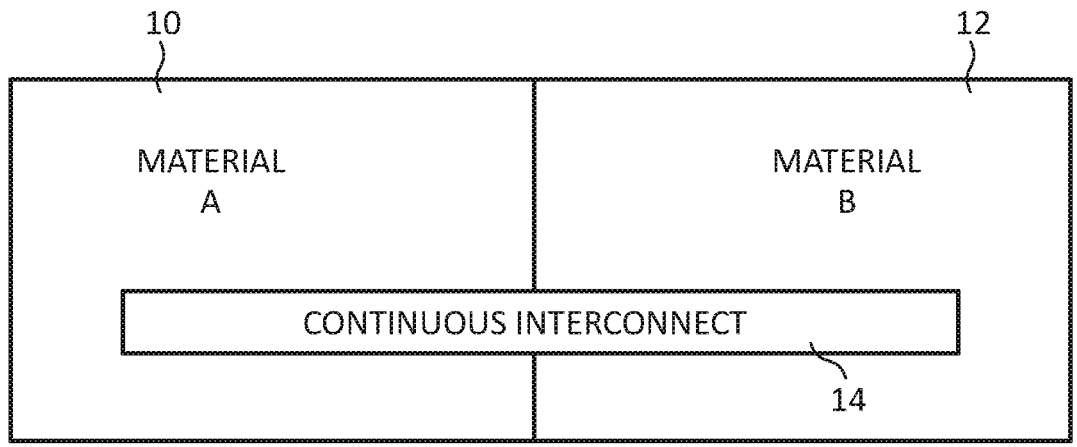
FIG. 1 illustrates an embodiment of a structure according to some of the inventive principles of this patent disclosure.
Figure 2:
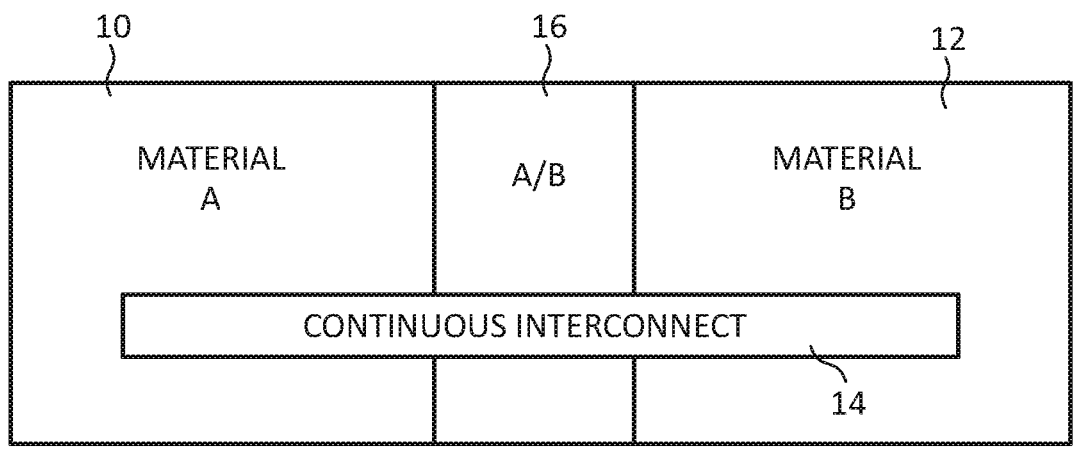
FIG. 2 illustrates another embodiment of a structure according to some of the inventive principles of this patent disclosure.

FIG. 1 illustrates an embodiment of a structure according to some of the inventive principles of this patent disclosure. The system of FIG. 1 may include at least two heterogeneous materials: material A (10) and material B (12). Materials A and B may be dissimilar in that they have at least one differing mechanical property, constraint, processing parameter, etc. One or more media 14 may extend between materials A and B to form a continuous interconnect between the materials. FIG. 2 illustrates another embodiment similar to that of FIG. 1, but the embodiment of FIG. 2 may include a transition A/B (16) between materials A and B.

Examples of suitable media 14 include viscous, elastic, viscoelastic and/or any other materials that may deform in response to deformation of one or more of materials A and B and then return to a previous form when one or more of materials A and B return to a previous form. The medium or media 14 may return to a previous form through its own action (e.g., if the medium is an elastic material) or through the action of one or more of materials A and B returning to a previous form (e.g., if the medium is a fluid).

In some embodiments, the media 14 may include one or more functional materials that may have at least one function that is not primarily structural, for example, conducting electricity, light, sound, etc., sensing one or more stimuli such as stress, strain, pressure, temperature, elongation, etc., mass transport (as of the material itself), thermal transport, mechanical linkage such as transmitting force, motion, pressure, vibrations, etc., and/or any other type of function. In some embodiments, a functional material may have at least one fluid property or component, for example, as a fluid phase material or a fluid component of a gel material, among others.

In some embodiments, the functional material may be implemented with a viscoelastic material having both a fluid and a solid component. Such a material may perform, for example, an electroactive function such as conducting electricity, or it may function as a mechanical interconnect, an actuating interconnect, a fuel line or fluid reservoir or any other function. The viscoelastic interconnect material may be arranged in any suitable geometry to accommodate any intended function.

In rheology G* may refer to a complex shear modulus which may contain two components: G' and G" which may be referred to as a storage modulus and loss modulus, respectively. The storage modulus may essentially characterize an elastic component of a material, whereas the loss modulus may characterize a viscous or liquid component of the material. In some embodiments, by selecting a function material to have a higher G' than one or both of materials A or B, the functional material may survive some degree of compression during formation and/or usage of the structure. In some embodiments, and depending on the implementation details, a storage modulus of a functional material may be considered "higher" than a storage modulus of one or both of the materials A or B if it is higher by an amount that may enable the functional material to withstand compression or other distorting stimulus during formation and/or usage while still remaining functional after formation and/or usage of the structure.

Examples of differing mechanical properties of materials A and B include modulus (e.g., Young's, shear, bulk, etc.), hardness (Shore, Mohs, Brinell, Rockwell, etc.), strength (e.g., tensile, compressive, etc.), density, etc.

Examples of differing processing parameters of materials A and B include temperature, pressure, time, reagents (e.g., reactants, solvents, catalysts, activators, etc.), exposure to UV, IR, RF, ultrasound treatment, etc.

Examples of differing constraints of materials A and B include deformation limits (e.g., because of having rigid components mounted thereon, placement on an object such as a human body or sensitive mechanical instrument, etc.), exposure limits (e.g., to temperature, radiation, UV, IR, RF, ultrasound, chemicals, etc.), etc.

The medium or media 14 that form the interconnect may be formed on one or more surfaces of materials A and/or B or transition A/B, in passages through any of materials A and/or B or transition A/B, or in any other arrangement that creates an operative interconnect between materials A and B.

The transition A/B, if any, may include overlap, interleaving, a material gradient, and/or the like, between materials A and B, and/or one or more intermediate, transitional, buffer, etc., materials between materials A and B.

Deformation of one or more of materials A and B, and corresponding deformation of the interconnect 14 may be in response to any or all of tensile, compressive, stretching, flexing, twisting, bulk, etc., forces on one or more of the materials A and B.

Examples of types of interconnect formed by medium or media 14 may include mechanical, electric, electrical, electronic, electromechanical, electromagnetic, and/or other electro-active interconnect, optical, photonic, audio, mass transport, etc.

Examples of materials suitable for use as materials A and B, in any combination, may include natural and/or synthetic polymers of any type including rubber and plastic materials such as silicone based materials including polydimethylsiloxane (PDMS), urethanes including thermoplastic polyurethane (TPU), ethylene propylene diene monomer (EPDM), neoprene, as well as epoxies, pure and alloyed metals, woven or nonwoven fabrics, wood, leather, paper, fiberglass and carbon and other composite materials, etc., or any combination thereof.

Examples of materials suitable for use as the medium or media 14 that form the interconnect include, but are not limited to, deformable conductors including conductive gels such as gallium indium alloys, some examples of which are disclosed in U.S. Patent Application Publication No. 2018/0247727 published on Aug. 30, 2018 which is incorporated by reference. Other suitable electroactive materials may include any conductive metals including gold, nickel, silver, platinum, copper, etc.; semiconductors based on silicon, gallium, germanium, antimony, arsenic, boron, carbon, selenium, sulfur, tellurium, etc., semiconducting compounds including gallium arsenide, indium antimonide, and oxides of many metals; organic semiconductors; and conductive nonmetallic substances such as graphite. Other examples of conductive gels include gels based on graphite or other forms of carbon and ionic gels. Examples of suitable non-electroactive compositions include many other types of gels such as, for example, silica gels, and chafing fuel such as Sterno, etc. Other examples include liquids such as water, oils, inks, alcohol, etc., any of which may be electroactive or not, as well as any elastic materials which may be electroactive or not.

Some additional inventive principles of this patent disclosure relate to the use of a structure such as those illustrated in FIGS. 1 and 2 to serve as an interconnect between heterogeneous materials hosting various specialty components in, for example, a deformable electronic assembly such as a Flexible Hybrid Electronics (FHE) assembly. In some non-limiting example embodiments, the interconnect may span heterogenous junctions between deformable circuit boards such as printed circuit boards (PCBs) like flexible printed circuit boards (FlexPCBs) and/or stretchable PCBs (StretchPCBs) and other deformable structures such as, for example, TPU or Silicone structures. Techniques that may be used to form such structures may include molding, adhesive bonding, thermoforming, tape bonding, ultrasonic bonding, and/or others. In some embodiments, such techniques may be combined with FHE technologies and one or more of the interconnects disclosed in this patent disclosure to create one or more integrated textile/electronic assemblies with applications, for example, in industrial, consumer and/or wearable electronics.

Mixed mode interconnects, particularly between hard and soft materials or rigid components and materials that conform into non-rectilinear shapes may present challenges in deformable electronics such as FHE. FHE and other deformable electronics may be applied in Internet-of-things (IoT) and wearable applications in which electronics may exist intimately with mechanical elements traditionally considered dissimilar from the mechanics of traditional electronic assembly. Materials such as fabric, rubber membranes, thermoformed plastics and similar may directly integrate electronic elements in order to support smart or actively controlled functionality.

Interconnects between dissimilar materials may be handled with specialty solders, conductive adhesives or mechanical connectors. However, some of these may involve compatibility with separate traces built onto two dissimilar substrates, each of which may have its own mechanical constraints. This may involve engineering of both the interconnect and the mechanics of the dissimilar materials and create substantial constraints and overhead on the design of an FHE or other deformable electronic device.

The inventive principles of this patent disclosure may enable potential interconnect problems such as multimodal metallization to be bypassed by employing continuous interconnects produced by conductive gels and/or other conductive functional materials through vias or other passages cut or formed into mixed material substrates, printed directly on the substrates, or arranged with the substrates in any other suitable manner. In some embodiments, continuous circuits including vias and other structures with single and/or mixed material multilayer circuit constructions may be fabricated with interconnects formed from conductive gels and/or other conductive functional materials. In some embodiments, components may be directly coupled to traditional electronic elements including Surface Mount Components, flex circuits and conductive fabrics through vias in adhesive substrates that may be filled with conductive gel and/or other conductive functional materials. Both of these constructions may produce ohmic, low impedance contacts with, for example, resistance to strain cycling and/or bend tests and/or with an ability to tolerate the dynamic loading placed on the structures both during final assembly and during use in applications such as wearable electronics, strain monitoring electronics, etc., where dynamic movement may be expected.

In some embodiments, the inventive principles of this patent disclosure may be applied to many substrate materials and manufacturing methods that may allow both the hosting of rigid Surface Mount Components on either FlexPCB or StretchPCB substrates and the creation of mechanically robust interconnects attached to the PCB components that would be able to undergo substantially greater strains all spanned by continuous wires constructed from conductive gels.

In some example embodiments, an FHE or other deformable electronic device may include both a first substrate portion that hosts surface mount components and a second substrate portion that functions as a relatively higher elongation textile integrated conductor and/or strain gauge produced with, for example, a conductive gel. The higher elongation portion of the circuit may provide a variable resistance and/or conductive path to the low elongation flex circuit which may host one or more passive and/or active surface mount technology (SMT) components capable of creating, for example, a visual output of the stretch experienced by the high elongation portion.

Some examples of materials that may be used for an FHE device or other deformable device according to some inventive principles of this patent disclosure include but are not limited to the following: any TPUs including, for example, a low Shore A TPU and/or other TPUs with high Shore A; thermoset and/or epoxy based films; silicones, for example any type of curing silicones that may be applied, e.g., to a high stretch knit fabric; copper or metal clad polyamide or other substrates which may be used in FlexPCBs, StretchPCBs, and/or the like; and any active and/or passive through-hole and/or surface mount components. In some example embodiments, copper clad polyamide and SMC components may be used to form a stable electrical connection to vias filled with conductive gels and may be applied, for example, as components in a hybrid assembly.

Figure 3:
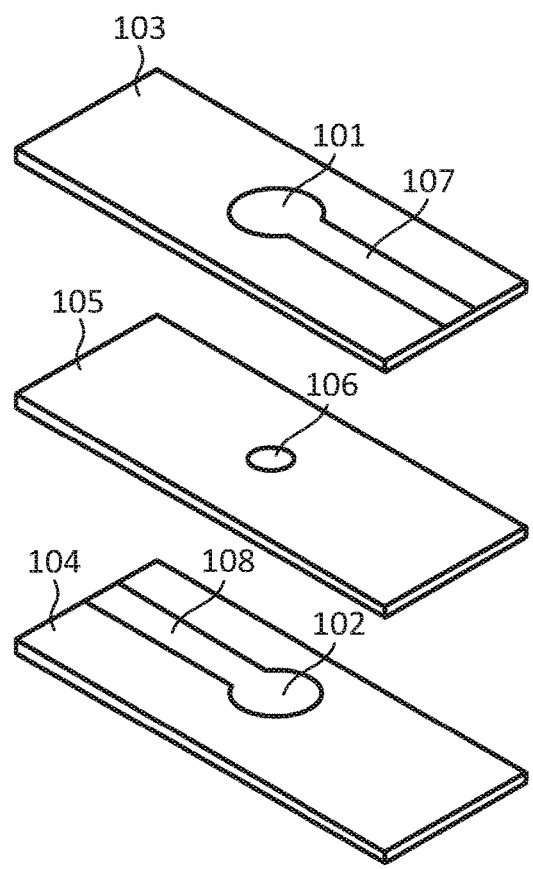
FIG. 3 is an exploded perspective view illustrating an example embodiment of an interconnect design according to some inventive principles of this disclosure.

FIG. 3 is an exploded perspective view illustrating an example embodiment of an interconnect design suitable for use with an FHE device or other device according to some inventive principles of this patent disclosure. Two pads 101 and 102 having diameters D1 and D2, respectively, on separate layers of dissimilar substrates A (103) and B (104), respectively, may be printed, for example, with a hole passing through the pads such that electrical continuity is achieved. Pad 101 may communicate with trace 107 on Substrate A, and pad 102 may communicate with trace 108 on Substrate B.

Pad size and via hole size may be chosen to facilitate design for manufacturability of the circuit board. In some example embodiments of heterogeneous interconnects on flexible and/or stretchable substrates, the size of these features may be chosen for the expected deformation of the substrates and/or to facilitate the assembly & testing of the heterogeneous interconnects. In some embodiments, these via pads may run directly to a surface mount component which may be adhered to the surface or to a pad on a circuit (e.g., a polyamide circuit).

The example of FIG. 3 is shown with a transition substrate A/B (105) having a via 106 with diameter D3 between overlapping portions of substrates A and B, but the transition substrate may be omitted in some embodiments. The materials used for substrates A and B and transition substrate A/B (if used) may be chosen from any of the materials identified above or any other suitable materials. The pads, traces and fill material for the vias may be implemented with conductive gels or any other suitable conducting materials.

Figure 4:
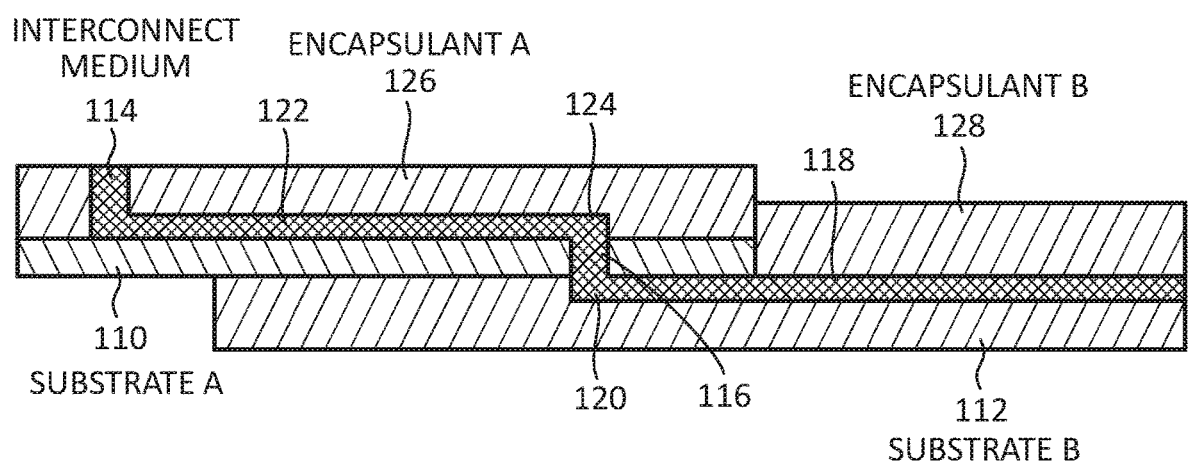
FIG. 4 is a cross-sectional view of another example embodiment of a heterogenous structure according to some inventive principles of this disclosure.

FIG. 4 is a cross-sectional view of another example embodiment of a heterogenous structure (which in some embodiments may be implemented as a layup) using conductive gel and/or other interconnect medium 114 as traces according to this disclosure. Substrate A (110) may overlap and be attached directly to Substrate B (112). In other embodiments, a transition substrate may be used. In this embodiment, a via 116 may be formed through Substrate A, for example, because the trace 122 and/or pad 124 on Substrate A may be aligned on top of the trace 118 and/or pad 120 on Substrate B, and therefore conductive gel in the via 116 of Substrate A may directly contact the pad 120 on top of Substrate B.

The structure illustrated in FIG. 4 may include one or more encapsulants to constrain and/or protect the traces, pads, and/or vias of conductive gel and/or other interconnect medium 114. For example, at least a portion of Substrate A may be coated with Encapsulant A (126), and at least a portion of Substrate B may be coated with Encapsulant B (128). Any suitable materials may used for encapsulants, for example, silicone based materials such as PDMS, TPUs, urethanes, epoxies, polyesters, polyamides, varnishes, and any other material that may provide a protective coating and/or help hold the assembly together. The substrates 110 and 112 may be bonded together using any suitable technique including adhesive bonding, thermoforming, tape bonding, ultrasonic bonding, etc.

Examples of applications in which a structure like that illustrated in FIG. 4 may be useful include applications in which substrate A may be implemented with a material that may be used to host one or more electronic components, whereas substrate B may be implemented with a material that may be used to provide a connection to a remote sensor, display, electronic module, etc. For example, substrate A may be fabricated from a relatively rigid material, whereas substrate B may be fabricated from a relatively flexible and/or stretchable material.

In some embodiments, the trace 122 may be formed on the bottom of substrate A (110), thereby eliminating the via 116. In such an embodiment, encapsulant A (126) may be applied to the bottom surface of substrate A (110). In some embodiments, Encapsulant A (126), and Encapsulant B (128) may be combined as a single component.

In some embodiments, some or all of the structure illustrated in FIG. 4, as well as any of the other structures described in this disclosure, may be fabricated at least in part using any of the materials and/or fabrication techniques described in U.S. Patent Application Publication No. 2020/0066628 published on Feb. 27, 2020 which is incorporated by reference may be used in conjunction with any of the methods and/or articles of manufacture described herein.

Figure 5:
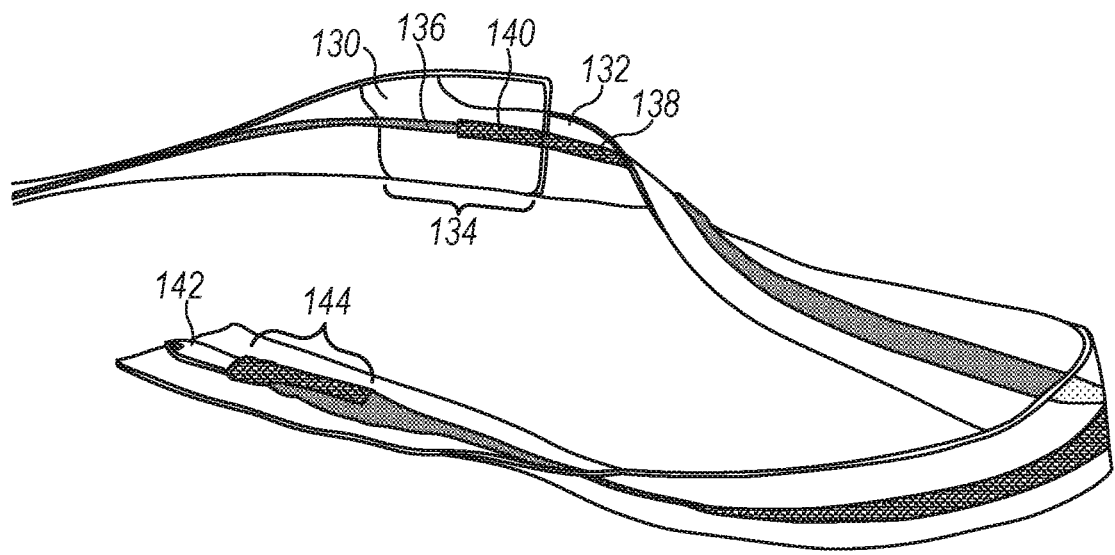
FIG. 5 illustrates another example embodiment of a heterogenous structure using conductive gel as a trace according to some inventive principles of this disclosure.

FIG. 5 illustrates another example embodiment of a heterogenous structure using conductive gel as a trace according to some inventive principles of this patent disclosure. In the embodiment illustrated in FIG. 5, a ribbon of thermoset plastic laminate 130 (material A) may overlap a ribbon of TPU 132 (material B) at an overlap region 134 (A/B). A heterogenous interconnect medium made from, for example, eutectic gallium alloy, may have a first portion 136 on material A, a second portion 138 on material B, and a transition portion 140 in the overlap region 134. All three portions of the trace may be encapsulated, for example, with one or more encapsulants such as silicone, TPU, urethane, epoxies, etc.

The thermoset plastic (material A) and TPU (material B) may have substantially different mechanical properties which are spanned by the continuous conductive trace, thus forming a heterogenous interconnect that transitions between two heterogeneous materials. For example, in some embodiments, the thermoset plastic laminate (material A) may be substantially more rigid than the TPU (material B).

An electromechanical connector such as a solderable connector 142 may overlap with the second portion 138 of the trace in an overlap region 144 to form another heterogeneous electrical connection between the continuous trace and any other electric apparatus. Alternatively, in some embodiments, a polyamide layer may be adhered to conductive fabric as a terminal layer to provide an interconnect between conductive gel encapsulated in TPU or Silicone and a solderable connector mechanically connected to the conductive fabric.

Figure 6:
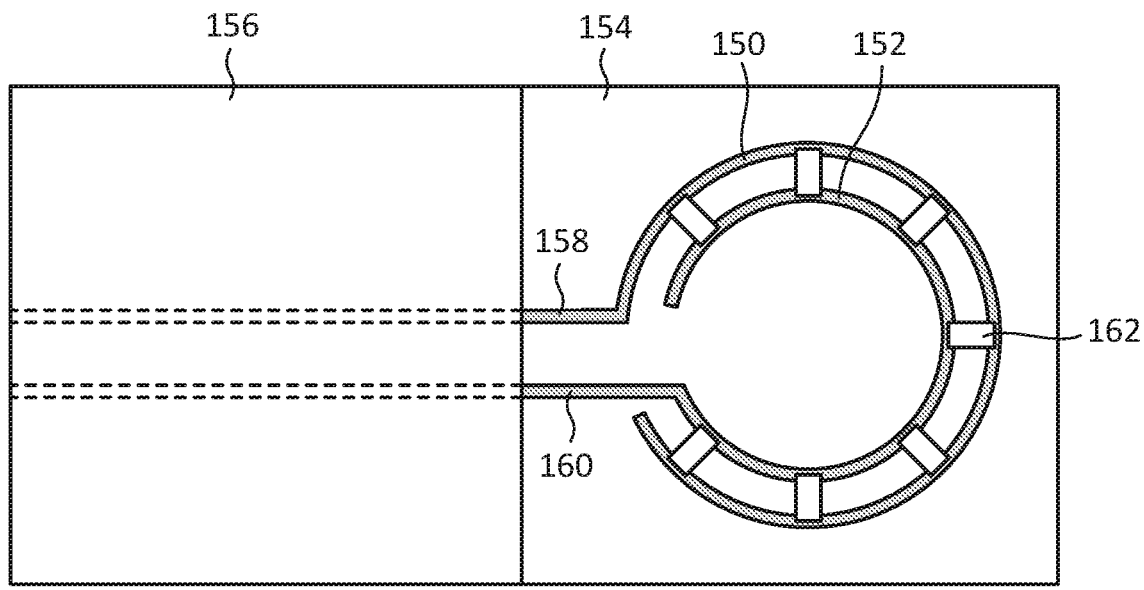
FIG. 6 illustrates another embodiment of structure having a continuous interconnect according to some inventive principles of this disclosure.

FIG. 6 illustrates another embodiment of a structure having a continuous interconnect according to this disclosure. In the embodiment illustrated in FIG. 6, an outer ring 150 of conductive gel and an inner ring 152 of conductive gel may be patterned on a first substrate 154 (material A) formed from a relatively rigid material such as thermoset plastic. The first substrate 154 may transition to a second substrate 156 (material B) formed from a relatively flexible and/or stretchable material such as a silicone. The first substrate 154 and second substrate 156 may transition through a lap joint, butt joint, or in any other manner. A first linear trace 158, which may be electrically connected to the outer ring 150, may be patterned on the first substrate 154 and the second substrate 156 so as to span the transition between material A and material B. A second linear trace 160, which may be electrically connected to the inner ring 152, may be patterned on the first substrate 154 and the second substrate 156 so as to span the transition between material A and material B.

One or more two-terminal electronic components such as light emitting diodes (LEDs) 162, may be mounted on the first substrate 154 with one terminal in direct contact with each of the inner and outer rings. The first substrate 154 may be encapsulated, for example, with a transparent encapsulant such as silicone to enable the LEDs to be visible through the encapsulant. The second substrate may be encapsulated, for example, with another layer of silicone, with the linear traces 158 and 160 bonded therebetween. The portions of the linear traces 158 and 160 shown in dashed lines may be covered by the encapsulant on the second substrate 154, which in some embodiments may not be transparent.

In some embodiments, a fabric mesh may be applied to the first substrate 154, for example, by including it within the encapsulant, or by bonding with another encapsulant, to provide selective strain limiting of the first substrate 154 and the patterns of conductive gel and LEDs formed thereon.

Thus, the embodiment illustrated in FIG. 6 may provide an electronic assembly in which a relatively rigid, but still flexible and/or stretchable substrate 154 (material A) may provide a base for electronic components, while providing electrical connections to the base through a relatively more flexible and/or stretchable substrate 156 (material B), in some implementations, without the use of any solid wires.

Conductive gels made from gallium alloys such as those described in U.S. Patent Application Publication No. 2018/0247727 may be particularly beneficial for use with interconnects between heterogeneous materials because they may be patternable on a wide variety of substrates including TPU, Silicones, Epoxies, EPDM and various thermoset elastomers. In some embodiments, the patterning method may be essentially graphic in nature and may form a mechanical bond between the substrate and conductive gels. In some embodiments, there may be no cure stage or chemical reaction which may aid in wetting functional patterns to many substrates. An example is a composition of Gallium-Indium-Tin eutectic alloy in which a crosslinked Gallium-Oxide nanostructure has been induced in order to change the viscosity and wetting parameters which allows the material to be controllably patterned onto a wide variety of substrates. Eutectic gallium alloy gels may also have no structure to break down on strain cycling because the material may conduct in an amorphous fluid state making it robust to strain cycling up to the limits of its substrate. Thus, they may provide an effective solution for interconnects between heterogeneous materials in FHE and many other applications, particularly in a crucial hard to soft transition. Eutectic gallium alloy gels may also have excellent electrical properties providing low resistance DC connections and transmission line parameters (primarily S11) up to 5 Ghz and beyond.

Figure 7:
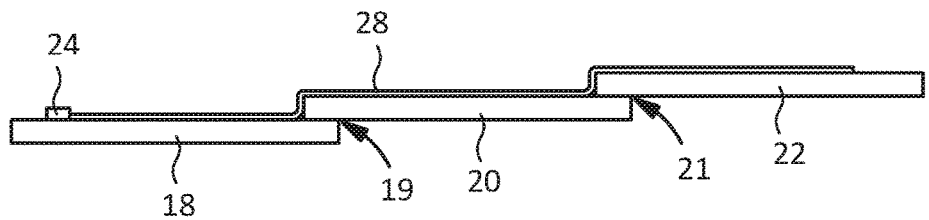
FIGS. 7 and 8 are side and top views, respectively, of an embodiment of a structure having continuous interconnects between dissimilar materials according to some inventive principles of this disclosure.
Figure 8:
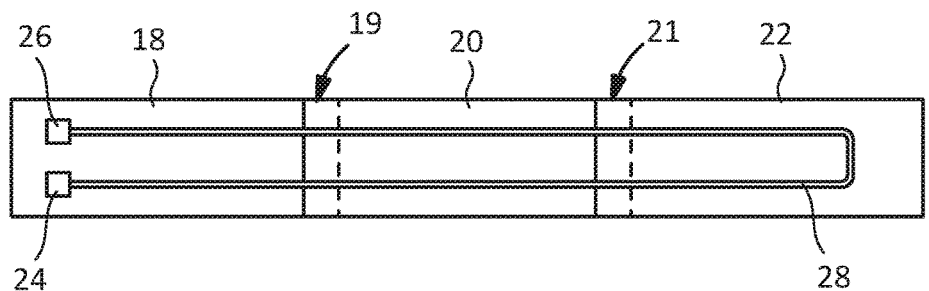

FIGS. 7 and 8 are side and top views, respectively, of an embodiment of a structure having continuous interconnects between dissimilar materials according to some inventive principles of this patent disclosure.

The embodiment of FIGS. 7 and 8 may include first, second and third dissimilar substrates 18, 20 and 22. In this example, the first substrate 18 may be a rigid TPU, the second substrate 20 may be a more flexible but still firm TPU, and the third substrate 22 may be a soft TPU, but the inventive principles are not limited to these details, and any combination of materials having various properties may be used. The first and second substrates may be bonded together at junction 19 using any suitable bonding technique, and the second and third substrates may be bonded together at junction 21 using any suitable bonding technique. The components in FIGS. 7 and 8 are not necessarily to scale. For example, the substrates may be made from very thin sheets of material, in which case the vertical scale of FIGS. 7 and 8 is exaggerated.

A trace of conductive medium such as a conductive gel may be formed in a U-shaped pattern 28 on the upper surfaces of the substrates and crossing over the junctions between the substrates. The ends of the U-shaped pattern 28 may terminate at contact pads 24 and 26 which may be conventional electric contact pads because of the rigid characteristic of the first substrate 18. Although not shown in FIGS. 7 and 8, an encapsulant may be formed over the U-shaped pattern 28 and top surfaces of the substrates 18, 20 and 22.

Figure 9:
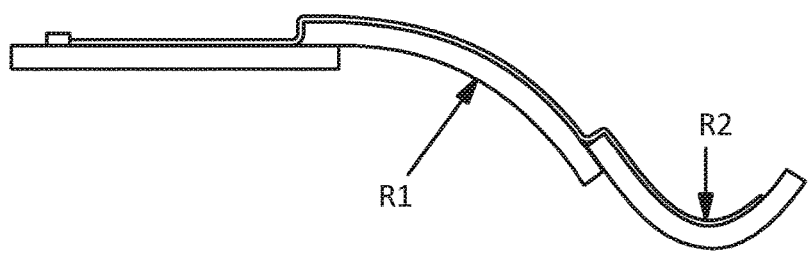
FIG. 9 is another side view of the structure of FIGS. 7 and 8.

The resulting structure may be bent in response to various forces with the different substrates providing different bend radii as shown by R1 and R2 in FIG. 9 which is another side view of the structure of FIGS. 7 and 8 showing it being deformed. In some embodiments, such a structure may function as a strain relief.

The structure of FIGS. 7 and 8 may also include transitions between other materials such as TPU to epoxy, silicone to epoxy, silicone to fabric or TPU, etc. In some embodiments, and depending on the implementation details, it may be particularly beneficial to have a continuous interconnect between TPU and silicone because it tends to be difficult to make electrical connections to silicone, but relatively easy to make electrical connections to TPU. Therefore, electrical connections may be placed on a TPU substrate which may then transition to silicone which may provide a more sensitive substrate for a sensor made from deformable conductors such as conductive gels.

In some embodiments, after printing a circuit via a stencil, flexographically or some other deposition process, an encapsulant layer with deformable conductor filled vias may be added, or the circuit exposed may simply be left exposed. Next, an integrated circuit (IC) or other electronic device may be placed on the circuit. A metal layer on the IC may form a low impedance, ohmic contact with the conductive gel. In some embodiments, the substrate itself may be adhesive, which may keep the IC (or a packaged surface mount component (SMC)) in place. Alternative, an adhesive may be placed onto a landing area or onto the IC (or SMC). Finally, an encapsulation layer can be placed over the assembly to hold the conductive gel and IC's in place.

In some embodiments according to the inventive principles of this patent disclosure, it may be beneficial to any of the soft interconnect attach, direct die attach, direct IC attach and/or soft interconnect COB (chip on board) process to have a very soft/conforming conductor. In some embodiments this may be achieved by using a conductive gel, e.g., a Gallium-Indium-Tin alloy with blended in oxides and micron scale particles to control viscosity. In some embodiments, such a technique may be utilized with other conformal conductors capable of making a low impedance contact with a metal layer.

In some other embodiments according to some inventive principles of this patent disclosure, a gasket made of a material such as EPDM (ethylene Propylene Diene Monomers) may have a pattern of deformable conductors arranged to sense the performance of the gasket. Since it may be relatively difficult to attach electric contacts to EPDM, the deformable conductors may be coupled through a continuous interconnect between the EPDM gasket and another material such as TPU which may be a good substrate for electric contacts. Thus, a sensing circuit may be connected to the contacts on the TPU substrate while still providing a good electric connection to the pattern of deformable conductors in or on the EPDM gasket.

Figure 10:
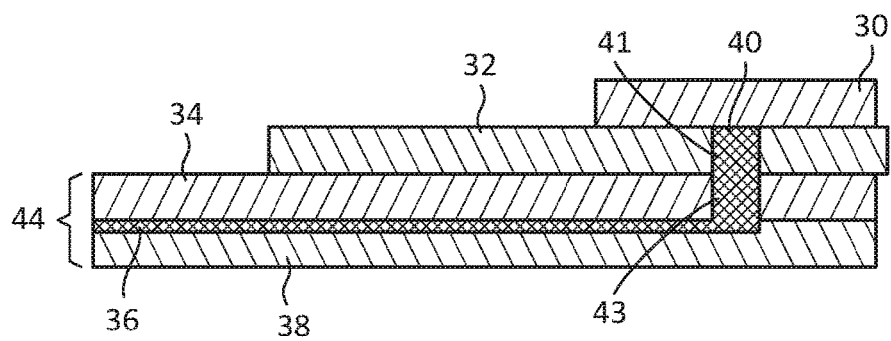
FIG. 10 is a cross-sectional view of another embodiment of a structure having continuous interconnects between dissimilar materials according to some inventive principles of this disclosure.

FIG. 10 is a cross-sectional view of another embodiment of a structure having continuous interconnects between dissimilar materials according to some inventive principles of this patent disclosure. The embodiment of FIG. 10 may include a pattern of conductive material 30 formed on a first substrate 32. The first substrate 32 may be attached to a second substrate 34 which may have traces 36 of a deformable conductor such as a conductive gel. An encapsulant 38 may cover the second substrate 34 and traces 36. Vias 41 and 43 through the first substrate 32 and second substrate 34, respectively, may enable the deformable conductor to form a continuous interconnect 40 between the pattern of conductive material 30 and the traces 36 on the second substrate 34. Any or all of the layers illustrated in FIG. 10 may have one or more dissimilar characteristics, and the use of a functional material such as a conductive gel for the continuous interconnect 40 and/or traces 36 may enable the assembly illustrated in FIG. 10 to be fabricated and/or operate while eliminating or reducing problems associated with material fatigue, material creep, galvanic action between multiple conductors, and/or the like.

The embodiment illustrated in FIG. 10 may be used for example, in a bio-electric sensor for an electrocardiogram (ECG or EKG), electromyogram (EMG), and/or the like. In such an embodiment, the conductive material 30 may be fabricated from conductive silicone, copper cladding, or other material appropriate for implementing an electrode suitable for contact with a patient's body. The substrates 32 and 34 may be fabricated, for example, from a material that may be rigid enough to host one or more electronic components, but flexible enough to comfort comfortably to a patient's body. Examples include TPU, polyamide, thermoset epoxy, thermoset plastics, etc.

In some example embodiments, the conductive material 30 may be implemented as conductive silicone which may be well-tolerated for skin contact, while the second substrate 34 may be implemented with epoxy to form a base for electronic components and/or other layers of traces for a circuit board. The first layer 32 may be implemented with TPU which may protect a patient from contact with the epoxy substrate 34 which may be an irritant to some patients.

Although the conductive trace 36 is shown on the bottom of the second substrate 34, in some embodiments, the conductive trace 36 may pass through the second substrate 34 which may serve, for example, as an in-place stencil to form the trace 36 which may be enclosed between the first substrate 32 and the encapsulant 38.

Some embodiments may include additional layers of substrates with additional vias, traces, etc. to form a functional circuit with one or more electrical and/or electronic components.

In some embodiments, the structure illustrated in FIG. 10 may include an interface 44 to connect the assembly to one or more other apparatus. For example, in some embodiments, the conductive trace 36 may transition to one or more terminals to couple the assembly to a cable or other conductive apparatus, for example, to read data from a sensor into which the assembly is integrated. In other embodiments, the interface 44 may transition to another heterogeneous junction such as that illustrated in FIG. 4, for example, to transition to a relatively high-elongation conductive assembly to connect the assembly to other apparatus.

In some embodiments, one or more of the substrates illustrated in FIG. 10 may be implemented as a fabric layer, or a fabric layer may be added as an additional layer. Such a fabric layer may be included for example, to provide patient comfort in the case of a bio-electric sensor. Moreover, additionally, or alternatively, such a fabric layer may be used to integrate the assembly into a piece of clothing or apparel, or other wearable apparatus such as a brace. Moreover, multiple assemblies such as that illustrated in FIG. 10 may be integrated into a single a piece of clothing or apparel, or other wearable apparatus with one or more flexible and/or stretchable substrates forming electrical and/or electronic interconnects between the assemblies.

Figure 11:
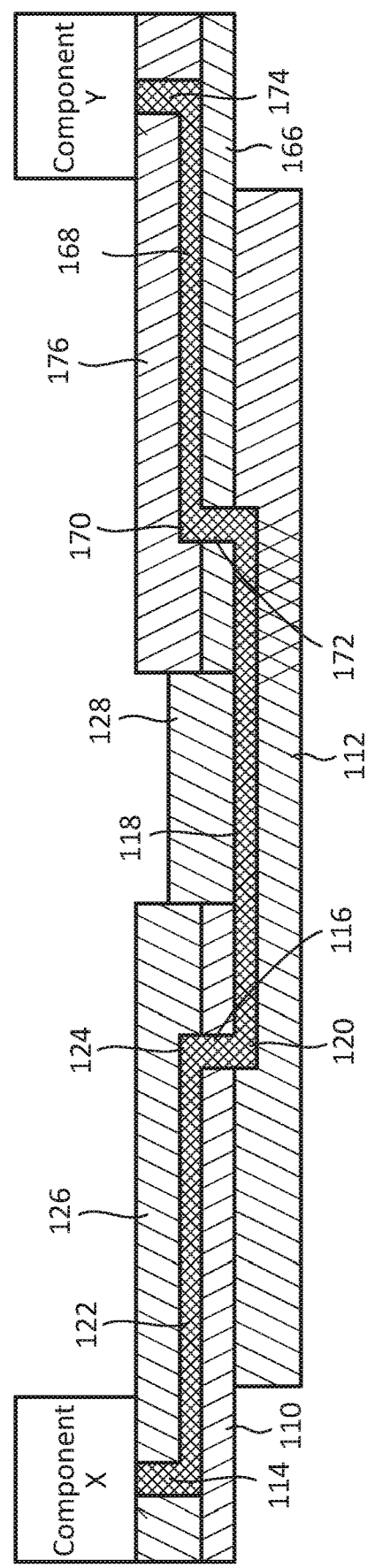
FIG. 11 is a cross-sectional view of another example embodiment of a heterogenous structure according to some inventive principles of this disclosure.

FIG. 11 is a cross-sectional view of another example embodiment of a heterogenous structure according to this disclosure. The embodiment illustrated in FIG. 11 may include components similar to those illustrated in the embodiment of FIG. 4, but the embodiment of FIG. 11 may further include a third substrate, substrate C (166) forming a second junction with substrate B (112). A trace 168, trace and/or pad 170, via 172, and/or via 174 may continue the continuous interconnect formed by interconnect medium 114 through trace 122 and/or pad 124, via 116 and trace 118 and/or pad 120. Another encapsulant C (176) may encapsulate the portion of the interconnect in or on substrate C. In some embodiments, any of the encapsulants A, B and/or C may be formed as a single layer.

In some embodiments, the structure illustrated in FIG. 11 may be used, for example, in an application in which it may provide a continuous functional interconnect between components X and Y. For example, component X may be implemented as a sensor, display, actuator and/or any other type of component that may be hosted on substrate A, which may be implemented, for example, with a material that may be relatively rigid enough to host the sensor, display, actuator, etc., of component X, for example, as a medical or other bio-sensor, industrial sensor, etc., but still flexible and/or stretchable enough to conform to a subject's body, piece of industrial equipment, parachute, clothing or other soft good, etc. Substrate A may then transition to substrate B, which may be implemented, for example, as a relatively more flexible and/or stretchable (e.g., high-elongation) material that may conduct one or more signals and/or operate as a sensor while extending along a certain distance to component Y. For example, substrate B may be sewn or bonded into or otherwise attached to an article of clothing, parachute cord, pipe, conduit, cable, etc. Substrate B may then transition to substrate C which may be implemented, for example, with a relatively rigid material such as a fiberglass or polyamide circuit board which may host a data collection and/or processing unit that may display data received from component X, send data to be displayed by component X, control one or more sub-components in component X, etc.

Thus, in some embodiments, and depending on the implementation details, an assembly such as that illustrated in FIG. 11 may provide a complete end-to-end interconnect solution between two components that may span multiple junctions between heterogeneous materials, which in turn may traverse multiple environments, while utilizing one continuous interconnect.

Some techniques that may be used for fabricating continuous interconnects between heterogeneous materials such as those illustrated in FIGS. 10 and 11 according to some inventive principles of this patent disclosure include those disclosed in the above-mentioned U.S. Patent Application Publication No. 2020/0066628 which is incorporated by reference, and which discloses methods for direct attachment of surface mount components to vias filled with a conductive gel and other interconnect media, and stenciling methods for manufacture a multilayer PCB that may be compatible with conductive gels and other interconnect media.

The embodiments disclosed herein may be described in the context of various implementation details, but the principles of this disclosure are not limited these or any other specific details. Some functionality has been described as being implemented by certain components, but in other embodiments, the functionality may be distributed between different systems and components in different locations and having various user interfaces. Certain embodiments have been described as having specific components, processes, steps, combinations thereof, and/or the like, but these terms may also encompass embodiments in which a specific process, step, combinations thereof, and/or the like may be implemented with multiple components, processes, steps, combinations thereof, and/or the like, or in which multiple processes, steps, combinations thereof, and/or the like may be integrated into a single process, step, combinations thereof, and/or the like. A reference to a component or element may refer to only a portion of the component or element. The use of terms such as "first" and "second" in this disclosure and the claims may only be for purposes of distinguishing the things they modify and may not indicate any spatial or temporal order unless apparent otherwise from context. A reference to a first thing may not imply the existence of a second thing. Moreover, the various details and embodiments described above may be combined to produce additional embodiments according to the inventive principles of this patent disclosure Since the inventive principles of this patent disclosure can be modified in arrangement and detail without departing from the inventive concepts, such changes and modifications are considered to fall within the scope of the following claims.

What is claimed is:

1. A deformable electronic device, comprising:
a substrate layer;
an encapsulant layer;
a trace formed from a deformable conductor disposed between the substrate layer and the encapsulant layer;
a pattern of conductive material; and
a continuous interconnect electrically coupling the trace and the pattern of conductive material, wherein the continuous interconnect comprises the deformable conductor.

2. The deformable electronic device of claim 1, wherein the deformable conductor is a conductive gel.

3. The deformable electronic device of claim 2, further comprising a stencil layer positioned between the encapsulant layer and the substrate layer.

4. The deformable electronic device of claim 3, wherein the stencil layer contains, at least in part, the deformable conductor.

5. The deformable electronic device of claim 1, wherein the pattern of conductive material is positioned on the substrate layer.

6. The deformable electronic device of claim 1, wherein the conductive material is comprised of conductive silicone.

7. The deformable electronic device of claim 6, wherein the pattern of conductive material forms an electrode.

8. The deformable electronic device of claim 7, wherein the electrode is an electrode for a bio-electric sensor.

9. The deformable electronic device of claim 1, further comprising a via extending through the substrate layer, wherein the via forms the continuous interconnect.

10. The deformable electronic device of claim 1, wherein the deformable conductor comprises a eutectic gallium alloy.

11. The deformable electronic device of claim 1, wherein the substrate layer and the encapsulant layer are comprised of a common material.

12. The deformable electronic device of claim 1 including an additional layer, wherein the additional layer is a fabric integrated to a wearable apparatus.

13. A deformable electronic device, comprising:
a first layer made from a first material;
a trace formed from a deformable conductor disposed on the first layer;
a second layer made from a second material; and
a continuous interconnect electrically coupling the trace to the second layer, wherein the continuous interconnect comprises the deformable conductor.

14. The deformable electronic device of claim 13, further comprising an encapsulant layer configured to encapsulate the trace between the first layer and the encapsulant layer.

15. The deformable electronic device of claim 13, wherein the deformable conductor is comprised of conductive gel.

16. The deformable electronic device of claim 13, wherein the first material is an insulating material and the second material is a conductive material.

17. The deformable electronic device of claim 13, wherein the deformable conductor further forms a via extending from the trace to the second layer and the continuous interconnect is located at the via.

18. The deformable electronic device of claim 17, further comprising a third layer made from a third material, wherein the trace is disposed between the first and third layers, and the via extends between the first and second layers.

19. The deformable electronic device of claim 18, wherein the third layer is a fabric integrated to a wearable apparatus.

20. A deformable electronic device, comprising:
a substrate layer;
an electronic component positioned on a first surface of the substrate layer;
a trace formed from a deformable conductor disposed on a second surface of the substrate layer opposite the first surface;
an encapsulant layer, encapsulating the deformable conductor with the substrate layer; and
a continuous interconnect electrically coupling the trace and the electronic component, the continuous interconnect formed from the deformable conductor.

* * * * *